(12) United States Patent
Shihadeh et al.

(10) Patent No.: US 9,170,757 B1
(45) Date of Patent: Oct. 27, 2015

(54) OPTIMIZATION OF RAID GROUP STORAGE

(71) Applicant: Violin Memory, Inc., Mountain View, CA (US)

(72) Inventors: Elias Shihadeh, Cupertino, CA (US); Anil Mandapuram, San Jose, CA (US)

(73) Assignee: VIOLON MEMORY INC., Santa Clara, CA (US)

( * ) Notice: Subject to any disclaimer, the term of this patent is extended or adjusted under 35 U.S.C. 154(b) by 316 days.

(21) Appl. No.: 13/911,632

(22) Filed: Jun. 6, 2013

Related U.S. Application Data

(60) Provisional application No. 61/657,161, filed on Jun. 8, 2012.

(51) Int. Cl.
*H03M 7/46* (2006.01)
*G06F 3/06* (2006.01)

(52) U.S. Cl.
CPC ............ *G06F 3/0679* (2013.01); *G06F 3/0619* (2013.01); *G06F 3/0638* (2013.01); *H03M 7/46* (2013.01)

(58) Field of Classification Search
CPC ... G06F 3/0679; G06F 3/0619; G06F 3/0638; H03M 7/46
USPC ....................................... 341/63, 59
See application file for complete search history.

(56) References Cited

U.S. PATENT DOCUMENTS

| | | | | |
|---|---|---|---|---|
| 5,394,143 | A | * | 2/1995 | Murray et al. ................. 341/63 |
| 5,734,340 | A | * | 3/1998 | Kennedy ........................ 341/59 |
| 6,199,064 | B1 | * | 3/2001 | Schindler .............................. 1/1 |
| 8,200,887 | B2 | | 6/2012 | Bennett |
| 8,984,241 | B2 | * | 3/2015 | Aizman ........................ 711/162 |

* cited by examiner

*Primary Examiner* — Khai M Nguyen
(74) *Attorney, Agent, or Firm* — Brinks Gilson and Lione

(57) ABSTRACT

A method of operating a memory system to compress data efficiently is described. The user data and the associated metadata are separated so that user data having repeating data patterns of greater length than a single user data structure may be assembled for storage. The user metadata and the repeating pattern metadata are stored in non-volatile memory such that the repeating pattern metadata can be used to reconstruct the repeating pattern of individual user data blocks. The reconstructed user data blocks are combined with user metadata, if any, and returned to the user in response to a read request.

14 Claims, 17 Drawing Sheets

OPTIMIZATION OF RAID GROUP STORAGE

This application claims the benefit of U.S. 61/657,161, filed on Jun. 8, 2012, which is incorporated herein by reference. This application is entitled to examination under the pre-AIA provisions of 35 U.S.C.

TECHNICAL FIELD

The present application may relate to the storage of digital information.

BACKGROUND

NAND FLASH memory is electrically organized as a plurality of blocks on a die (chip), and a plurality of dies may be incorporated into a package, which may be termed a FLASH memory circuit. The chip may have more than one plane so as to be separately addressable for erase, write and read operations. A block is comprised of a plurality of pages, and the pages are comprised of a plurality of sectors. Some of this terminology is a legacy from hard disk drive (HDD) technology; however, as used in FLASH memory devices, some adaptation is made. NAND FLASH memory is characterized in that data may be written to a sector of memory, or to a contiguous group of sectors comprising a page. Pages can be written in order within a block, but if page is omitted, the present technology does not permit writing to the omitted page until the entire block has been erased. This contrasts with disk memory where a change to data in a memory location may be made by writing to that location, regardless of the previous state of the location. A block is the smallest extent of FLASH memory that can be erased, and a block must be erased prior to being written (programmed) with data.

Earlier versions of NAND FLASH had the capability of writing sequentially to sectors of a page, and data may be written on a sector basis where the die architecture permits this to be done. More recently, memory circuit manufacturers are evolving the device architecture so that one or more pages of data may be written in a write operation. This includes implementations where the die has two planes and the planes may be written simultaneously. All of this is by way of saying that the specific constraints on reading or writing data may be device dependent, but the overall approach disclosed herein may be easily adapted by a person of skill in the art so as to accommodate specific device features. The terms "erase" and "write" in a FLASH memory have the characteristic that when an erase or a write operation is in progress, a plane of the FLASH memory chip on which the operation is being performed is not available for "read" operations to any location in a plane of the chip.

One often describes stored user data by the terms sector, page, and block, but there is additional housekeeping data that is also stored and which must be accommodated in the overall memory system design. Auxiliary data such as metadata, including error correcting codes and the like that are related in some way to stored data is often said to be stored in a "spare" area. The spare area may be allocated on a sector, a page, or a block basis. Typically the organization of the data and auxiliary data follows that format of the disk memory systems due to the use of legacy user software. But, a page of a block or the block of data may be somewhat arbitrarily divided into physical memory extents that may be used for data, or for auxiliary data. So there is some flexibility in the amount of memory that is used for data and for auxiliary data in a block of data, and this is managed by some form of operating system abstraction, usually in one or more controllers associated with a memory chip, or with a module that includes the memory chip. The interface between the non-volatile memory cells and the chip bus is typically a volatile buffer memory, and the buffer memory may have a size equal to that of a data page plus the space for auxiliary data.

The management of reading of data, writing of data, and the background operations such as wear leveling and garbage collection, are performed by a system controller, using an abstraction termed a flash translation layer (FTL) that maps logical addresses (LBA), as understood by the user, to the physical addresses (PBA) of the memory where the data values are actually stored. The generic details of a FTL are known to a person of skill in the art and are not described in detail herein. The use of a FTL or equivalent is assumed, and the discussion herein takes the view that the abstraction of the FTL is equivalent of mapping the logical address of a page of user data to a physical memory location. The location may be a page of a physical memory block. This is not intended to be a limitation, but such an assumption simplifies the discussion.

SCSI compatible disk drives may be reformatted to 520-byte sectors, yielding 8 extra bytes per sector. These 8 bytes have traditionally been used by RAID controllers to store internal protection information. The T10-DIF (Data Integrity Field) is an extension to the SCSI Block Commands that standardizes the format of the 8 extra bytes associated with each 512 byte user sector and defines ways to interact with the contents at the protocol level.

Each 8-byte DIF tuple is split into three chunks:
- a 16-bit guard tag containing a CRC of the data portion of the sector;
- a 16-bit application tag; and,
- a 32-bit reference tag which contains an incrementing counter for each sector.

The T10-DIF format has been standardized, so both initiators and targets (as well as potentially transport switches in-between) are able to verify the integrity of the data. When writing, the host bus adapter (HBA) may DMA (direct memory access) transfer 512-byte sectors from a host memory, generate the matching integrity metadata and send out 520-byte sectors to the storage device. The disk controller will verify the integrity of the data before committing it to non-volatile storage. When reading the data, the disk controller will send 520-byte sectors to the HBA. The HBA will verify the data integrity and DMA 512-byte sectors to host memory. Since current generation software products are usually designed to be used with rotating media storage systems, a FLASH memory system, while not subject to many of the constraints of a mechanical disk system, is nevertheless constrained to be at least compatible with the existing software architectures.

SUMMARY

A method of operating a memory system having a controller and a memory module, is described comprising: the controller receiving a data structure having a user data block and metadata for the user data block. The controller separates the user data block from the metadata and assembles a plurality of user data blocks without the metadata such that the plurality of user data blocks without the metadata such that the plurality of user data blocks occupy contiguous memory locations of a page of memory. The separated metadata is store such that the metadata associated with the user data blocks occupies contiguous memory locations in a page of memory.

The page of memory having the user data blocks and the separated metadata is read in response to a read request and a user data block and the corresponding metadata is used to reform the data structure to be returned to the user.

The method may also include processing the plurality of user data blocks forming a page of memory to determine if a repeating data pattern is present. The type of data pattern and the run length thereof may be determined and stored as metadata in place of the user data having the repeating data pattern. The user data having the repeating data pattern is not stored to the non-volatile memory.

The metadata for a page of memory is read in response to a read command from a user and the repeating data pattern is generated for the corresponding user data block. The generated data block and the corresponding user metadata read from the memory are used to reform the data structure and the data structure may be returned to the user.

In an aspect, strips of a RAID stripe from a page of user data blocks and the separated metadata and an error correcting code, which may be, for example, a parity, computed over the user data blocks and the separated metadata may be stored on a plurality of memory modules. The error correcting code may be stored on another memory module such that the data and metadata are reconstructable using less that all of the memory modules.

In an aspect, the plurality of user data blocks forming a page of memory of a memory module may be processed to determine if a repeating data pattern is present and the type of data pattern and the run length of the repeating data pattern determined. The data pattern designation and run length for each repeating data pattern may be stored in a memory module used for the metadata of the RAID stripe. The data represented by the repeating data metadata need not be stored, and the metadata corresponding to the repeating data pattern and the user metadata may be written to non-volatile memory. The metadata for a RAID stripe may be read in response to a read command from a user and the repeating data pattern of a data block identified by the metadata generated. The data may be combined with the corresponding user metadata, if any, and the data structure returned to the user.

The metadata used to reform the data structure may have the same the same value as originally received from the user. An example of such metadata may conform to the T10-DIF standard.

In another aspect, a method of operating a memory system having a controller and a memory module, includes: receiving by the controller a data structure having a user data block and metadata for the user data block; processing a plurality of user data blocks to determine if a repeating data pattern is present; determining a type of data pattern and a run length for each repeating data pattern; storing metadata representing the data pattern designation and run length for each repeating data pattern; deleting the data corresponding to the repeating data pattern; forming a page of data from the user block metadata and the run length metadata; and writing the page of data to non-volatile memory module.

The method may further include: computing an error correcting code for the data of the page of data stored to non-volatile memory; and, writing the error correcting code to a memory module not containing the page of data.

A page of data or the error correcting code may be read in response to a read command from a user and i the metadata corresponding to the data structure of the read command identified. The repeating data pattern using the metadata to form the user data block; and, the user data block and the corresponding metadata may be combined to reform the data structure.

BRIEF DESCRIPTION OF THE DRAWINGS

FIG. 7A-7I, show 16 user data pages of (FIG. 3) 520 bytes each user page stripped of the associated user metadata, and the metadata is relocated to a $17^{th}$ "sector" (sector 16) along with any system metadata.

DESCRIPTION

A method of optimization of the storage of data in a RAID group of a non-volatile memory system is described.

Exemplary embodiments may be better understood with reference to the drawings, but these examples are not intended to be of a limiting nature. Like numbered elements in the same or different drawings perform equivalent functions. Elements may be either numbered or designated by acronyms, or both, and the choice between the representation is made merely for clarity, so that an element designated by a numeral, and the same element designated by an acronym or alphanumeric indicator should not be distinguished on that basis.

When describing a particular example, the example may include a particular feature, structure, or characteristic, but every example may not necessarily include the particular feature, structure or characteristic. This should not be taken as a suggestion or implication that the features, structure or characteristics of two or more examples should not or could not be combined, except when such a combination is explicitly excluded. When a particular feature, structure, or characteristic is described in connection with an example, a person skilled in the art may give effect to such feature, structure or characteristic in connection with other examples, whether or not explicitly described.

Figure 1:
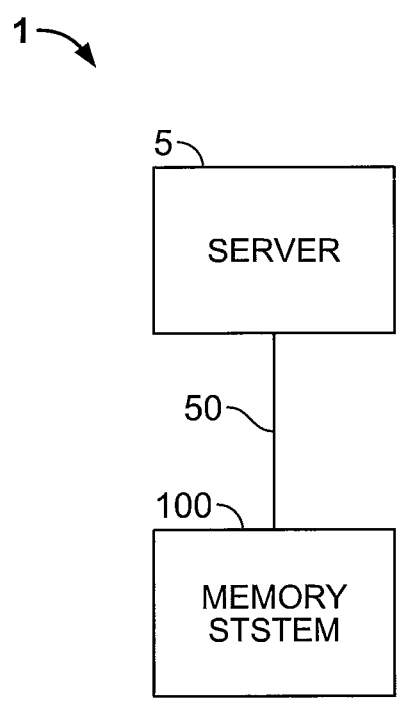
FIG. 1 is a block diagram showing the relationship of a memory system to a server.
Figure 2:
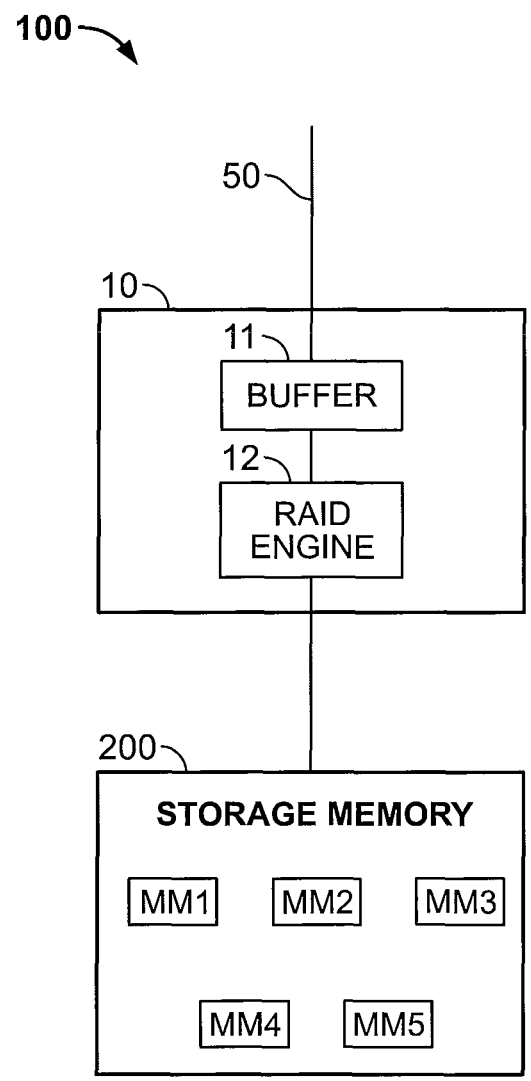
FIG. 2 is a block diagram of the memory system being operated as a RAIDed memory.
Figure 3:
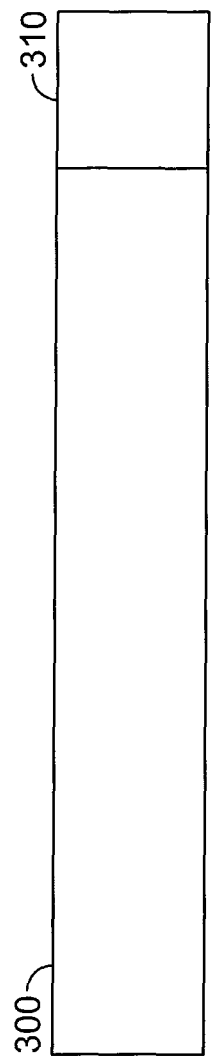
FIG. 3 is a representation of a data structure of a sector of data having a data portion and a metadata portion.

FIG. 1 shows a simplified block diagram of a memory system where data is received by a memory system 100 from a host computer 5, server or client over an interface 50 or from other data sources such as an iSCSI or SATA interface, for example. The memory system 100 may comprise a RAID controller and a plurality of memory circuits 200 in communication with the RAID controller 10. The plurality of memory circuits 200 may be comprised of memory modules MM as shown in FIG. 2, which may in turn be comprised of memory devices, which may be FLASH memory. The data that is received from a host 5 may be comprised of user data 300 and metadata 310 associated with the user data 300 as shown in FIG. 3. In an example, the metadata 310 may include the T10-DIF field. So, a 512 byte sector of user data may have, for example 8 bytes of metadata data added by the initiator of the data, such as the host 5. Where the metadata is compliant with T10-DIF, the data protection may include a guard tag, a computed cyclic redundancy code (CRC), and other data such as the source-assigned logical block address (LBA). Other metadata configurations may be used. As the T10-DIF data transmitted by the user to the memory system needs to be appended to the user data returned to the user when the LBA is requested, the data needs to be stored, or reconstructed, when reading the data.

In a system using RAID (other than the pseudo-case of RAID 0 where there is no redundancy), there are sufficient memory circuits MM so as to permit the writing of data to a group of memory circuits MM of the plurality of memory circuits, the group having at least another of the memory circuit MM to store redundancy data for the RAID group, so that a failure of one or more memory circuits MM of the RAID group does not result in the loss of user data. The user data (including the auxiliary data) may be reconstructed from less than all of the user data and the redundancy data by methods that are known in the art.

In an aspect, the RAID controller 10 receives user data 300 to be written to the memory circuits MM from the host 5 in blocks of logical block address (LBA) space, and converts data to a plurality of strips of data which may be stored in a selected group of memory circuits MM of the memory 200 that comprise a RAID stripe of a RAID group, which includes a memory circuit MM for redundancy data. The data may be temporarily stored in buffer memory 11, where the data may be rearranged for storage, computation of parity, or other processing operations. Redundancy data, which may be, for example, a parity over the strips of the stripe of data is computed and may be stored one or more additional strips of data. This redundancy data may be in addition to the error correcting code (ECC) that is associated with each sector or page of a MM to correct errors in recovering data from the FLASH memory circuits of an individual MM. Each LBA of the host-supplied data may represent the base address of a sector or other predefined data extent and may be mapped to the memory system address architecture.

A person of skill in the art will appreciate that multiple parity RAID versions exist, as well as versions where the memory module MM on which the parity data exists for a particular RAID group is rotated through the address space of the memory modules MM so as to distribute the redundancy data for purposes of, for example, bus load balancing. The data of a sector or a page of data is distributed as strips over a stripe of memory modules MM, so that the data may be reconstructed where less than all of the data has been returned to the RAID controller, but there is sufficient parity data. A discussion of this subject may be found in U.S. Pat. No. 8,200,887, issued on Jun. 12, 2012, which is commonly assigned and which is incorporated herein by reference.

In the case of single parity, either all of the user data from the memory circuits MM may be used; or, one less than the number of strips of user memory data and the parity data for the stripe may be used to recover the user data. Such an arrangement is suitable for an "erase hiding" configuration of a memory system where the write operations to the memory modules MM are arranged such that one of the two combinations of recovered data described above obtains, and the latency of data reading arising from write or erase operations is obviated.

The number of strips in a RAID stripe may depend on the native block size of the data being written which, for some presently available FLASH memory circuits, can be either 4 KB or 8 KB, and on the RAID protocol which can be, for example, RAID3 or RAID6. Table 1 shows examples of the number of strips in a stripe of a RAID group, where each strip of the stripe is to be stored on an independent memory module MM. The term independent memory module should be understood to mean that a failure of a memory module MM does not affect other memory modules of the same type on which the remaining data of a RAID stripe has been stored.

In the case of RAID 6, up to two of the memory modules MM storing data of the stripe may fail, manner without the user data being lost. This is also consistent with obviating the latency due to write or erase operations, where up to two of the MM are performing erase or write operations simultaneously.

TABLE 1

Number of Strips for Each Configuration

| | RAID TYPE | |
|---|---|---|
| | RAID 3 | RAID 6 |
| 4 KB | 5 strips = 4 data strips + 1 Parity strip | 6 strips = 4 data strips + 1 Parity strip + 1 Galois strip |
| 8 KB | 9 strips = 8 data strips + 1 Parity strip | 10 strips = 8 data strips + 1 Parity strip + 1 Galois strip |

The received user data 300 may be comprised of conventional sectors (e.g., 512 bits) and the data may have appended metadata 310 such as T10-DIF. The storage system 100 may append further metadata, such as error correcting code (ECC) or the like. The ECC may be computed over one or more of the sectors of data to be stored.

Figures 4A, 4B:
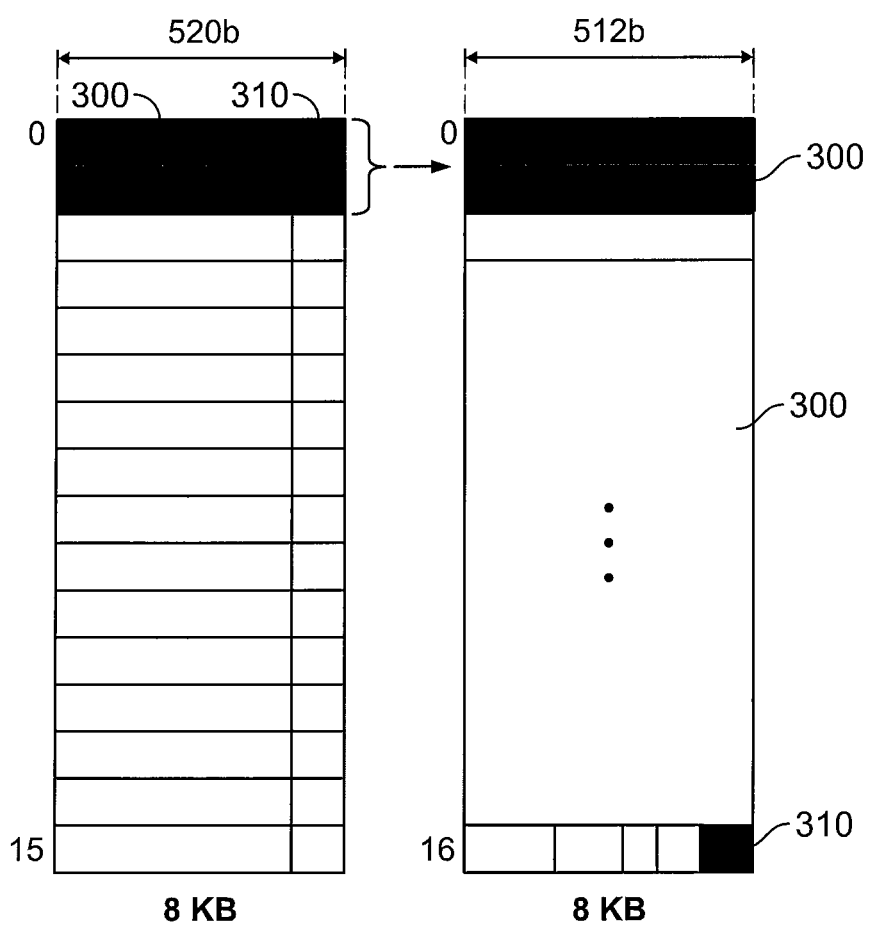
FIG. 4A is a representation of an 8 KB page of storage where the data structure of FIG. 3 is stored without modification as sectors of a page.
FIG. 4B shows the an example of modifying the storage locations of the data and the corresponding metadata so that the data portions are sequential and the metadata for all of the sectors is amalgamated.

The data of an 8 K range of continuous LBAs visualized as shown in FIG. 4A. This data may represent 16 consecutive sectors of user data 300 of nominal size 512 bytes, each sector having metadata 310 appended thereto, or be mapped from another set of user data where the pages may not be consecutive. The data is assembled thusly, as writing to FLASH memory is subject to some constraints, as is known in the art. Particularly, the sectors of a page need to be written successively, as do the pages of a block of data. As it is generally more efficient to write data in full page increments (in these examples nominally 4 KB or 8 KB), the data may be assembled, or otherwise processed by the RAID controller 12 or a controller on the memory module MM so as to result in a full page of data.

At some stage in the data processing, the data of a sector may be examined to determine if there is a repeating pattern of bits that may be represented by a smaller number of bits. This data compression may involve run-length encoding lossless data compression such as, run length encoding, Lemple-Ziv coding, Huffman coding, cryptographic hashing, or the like. Such processing may be used to reduce the size of a data file, or to reduce the amount of data that is being transmitted on a bus. The repeating pattern is often either all "0" or all "1". Other repeating patterns may be encountered. The user may have compressed the data prior to transmission, and have used a lossy compression method. While this may preclude further data compression, the user data is returned in exactly the same form as received from the user.

In a RAIDed system, the data of a compressed sector may be stored in a plurality of memory modules, so as to preserve the organization of the RAID memory approach; however, the compressed data may be transmitted in the memory at a higher effective data rate, as the redundant user data need not be transmitted: a representation of the compressed data will suffice. The larger the run length of the encoded data, for example, the less data that needs to be actually transmitted over the bus to represent the data to be stored. This may be a consideration in optimizing the performance of a bus-transfer-limited system.

Compressed data may be rearranged so that the run length of the each instance of the compressed data may be increased. This may be advantageous where the user application has a data set comprised mostly of empty cells or cells organized as a repetitive pattern.

A FLASH memory device may be organized into a plurality of blocks of pages having a size of 4 KB or 8 KB, for example, where the size that is stated is the space typically used for user data. Additional storage space in the FLASH memory page is provided for user metadata and error correcting code (ECC) data, but may be used for any purpose. The additional data storage space may be, for example, 24 bytes per 512 sector; however, the page comprising 16 sectors may be written as 8 KB of user data followed by 384 bytes of metadata (where we use the term metadata to mean any data that is not considered as user data). That is the 24 bytes of additional storage space for each sector may be relocated to, for example, the last sector of the page, as shown in FIG. 4B.

One may occasionally find confusion when using the term 8 KB to represent the native block size, as the actual amount of data stored in such a page may be, for example, 8196 bytes of user data and 384 bytes of metadata for a total of 8580 bytes. The size of the additional storage space may be dependent on the manufacturer and a specific amount of additional storage is not to be implied by the present example. In the present example, 8 bytes of the 24 bytes of the additional space per sector may be used to store the T10-DIF data 310 and the remaining 16 bytes used to store other metadata. This discussion often uses the term metadata to mean the combination of the user metadata 310 and the other metadata.

FIG. 4B shows a rearrangement of the 8 KB page of FIG. 4A so that the user data 300 of the nominal 8K data page of FIG. 4A is formatted such that all of the user data 300 is in the first 15 of the sectors, and all of the metadata 310 (including any metadata added by the memory system) is found in the last sector. The "sector" size is adjusted accordingly. Where the user data 300 is all zeros, for example, the run length of each of the sectors of FIG. 4A is 512 bytes, but the run length of FIG. 4B under those circumstances would be 8192 bytes. The greater the run length, the less actual data that needs to be transmitted over the system busses so as to losslessly represent the user data 300.

Figure 5:
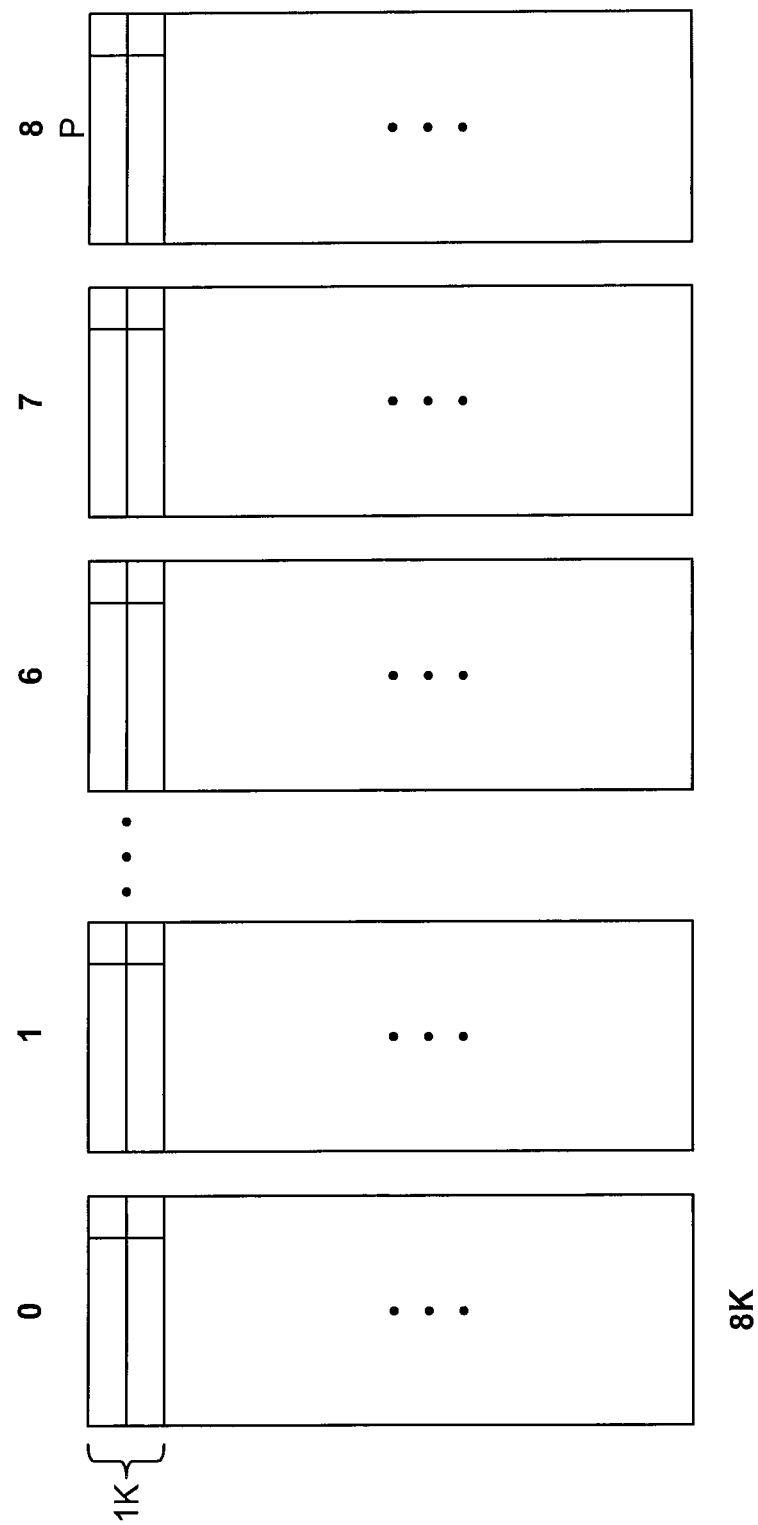
FIG. 5 illustrates the equivalent arrangement for the data of FIG. 4A when the data is being stored in a RAIDed memory system and one of the memory modules is being used to store parity data for the sectors of user data and associated metadata.

However, the storage of a sector of user data 300 in a single FLASH memory module does not lend itself to efficient operation of a memory system where erase hiding is used. The page of sectors of the original data (FIG. 4A) may need to be striped across the RAID group and a parity computed over the RAID group so as to allow for low-latency data recovery. FIG. 5 shows the data of FIG. 4A striped across 8 memory modules MM(0-7) and another memory module MM(8) for parity, the memory modules MM comprising a RAID group. This arrangement has a maximum run length of 512 bytes.

Two sectors of the page of FIG. 4A are shown as mapped to each of the physical memory pages of FIG. 5, so that the 8K of user data is striped across the RAID group. In this example, the physical memory page size to be written is 8 KB, and an 8 KB input data page (FIG. 4A) supplies 1 KB of striped data to each MM of the RAID group. Another seven input data pages are striped across the RAID group so as to form 9 (including a parity page) 8 KB pages that may be written to the memory modules MM.

Another characteristic of NAND FLASH memory is that, if data is written to any sector of a page, after completion of the write operation the page must first be erased before new data can be written to the page. The data pattern of FIG. 5 results in writing data to all of the 9 pages in the RAID group, even if all of the user data 300 comprises zeros or ones, since at least the user metadata 310 needs to be written. So, while the amount of data sent over a bus between the RAID controller 10 and the plurality of memory modules 200 may be reduced where there is compressible data, each of the input data pages of the RAID group is mapped to a plurality of pages of FLASH memory where the total amount of physical memory need is determined by the logical memory space (including the metadata)

Figure 6:
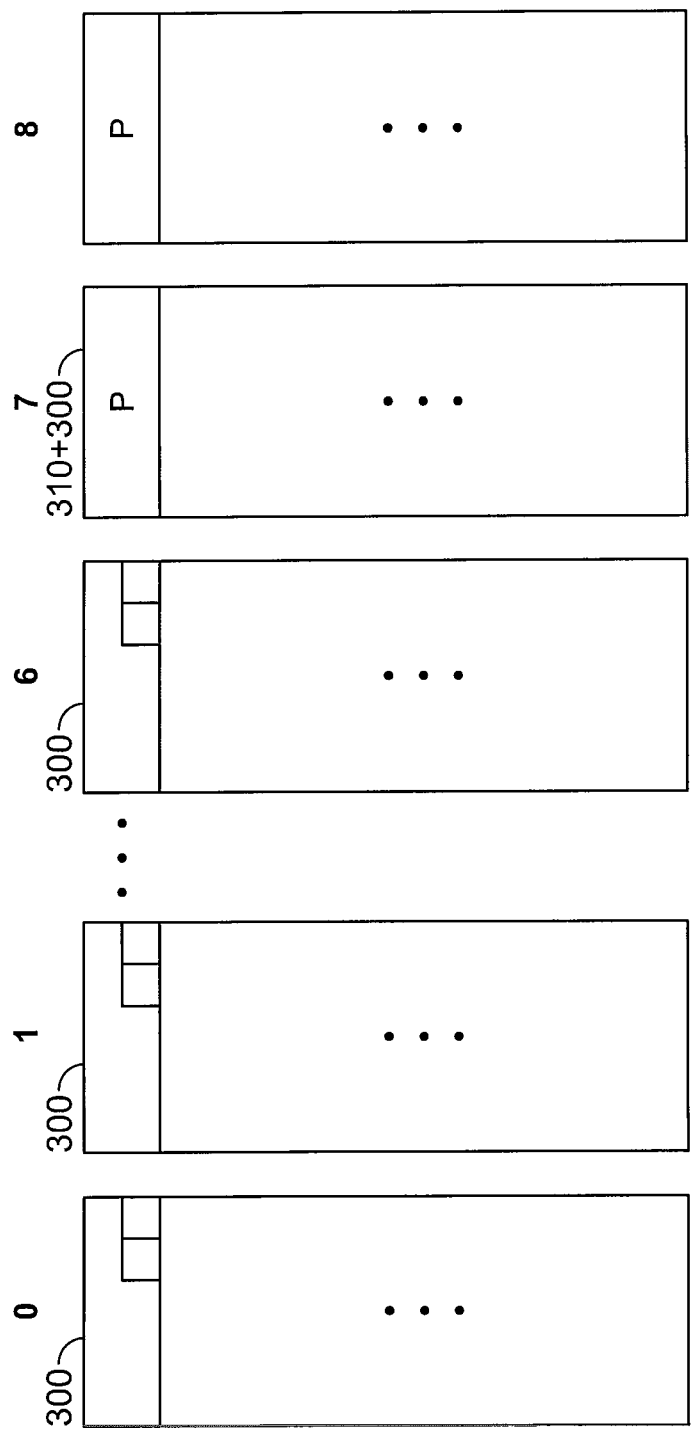
FIG. 6 illustrates the equivalent arrangement for the data of FIG. 4B when the data is being stored in a RAIDed memory system and the metadata for the sectors is consolidated in a memory module.

Alternatively, the rearranged data of FIG. 4B may be mapped to a RAID stripe, resulting in the pattern of FIG. 6. In this arrangement, MM(0-6) of the RAID group have only user data 300, MM7 has both metadata 310 and user data 300, and MM8 has the parity data for the other pages of the RAID group. Where a sector has a sufficient run length of data for compression, the run length information, the associated data pattern or data pattern descriptor, and the like may be stored in MM7. Should the data be sufficiently compressible, there may be no need to store any user data in MM0-6.

To reallocate the user data 300 and user metadata as in FIG. 6, a 512 bit sector may be divided into 8 strips of 64 bytes and each of the strips directed towards a separate memory circuit MM. This means that, for example, a 1 KB portion of memory page may store data from 16 different user data sectors.

In the example shown in FIG. 7A-7I, 16 user data pages of (FIG. 3) 520 bytes each are stripped of the associated user 310 metadata, and the metadata is relocated to a 17$^{th}$ "sector" (sector 16) along with any system metadata. The 17$^{th}$ "sector" may be less than 512 bytes and is equal in size to the total amount of spare space provided by the manufacturer for all types of metadata (384 bytes in this example) for the 8 KB page. When the user data is appropriately mapped to the strips, 7 of the 9 strips of a RAID group contain only user data. If the user data can be compressed, then 16 sectors each comprising 512 bytes of user data are mapped to 7 strips of nominally 1 KB size (actually 1024+2×24=1072 bytes) which can be compressed as a whole. Recalling that the data block to be written to the flash memory is 8 KB (+384 bytes), if all of the user data is compressible, then only one descriptor need be transmitted and stored for 8 KB of user data. This 8 KB block may be made up of the 1 KB contributions from 8 different groups of user LBA sectors. All of the uncompressible or poorly compressible data may be relegated to one of the 8 KB pages of the stripe: in this example MM7.

Figure 7A:
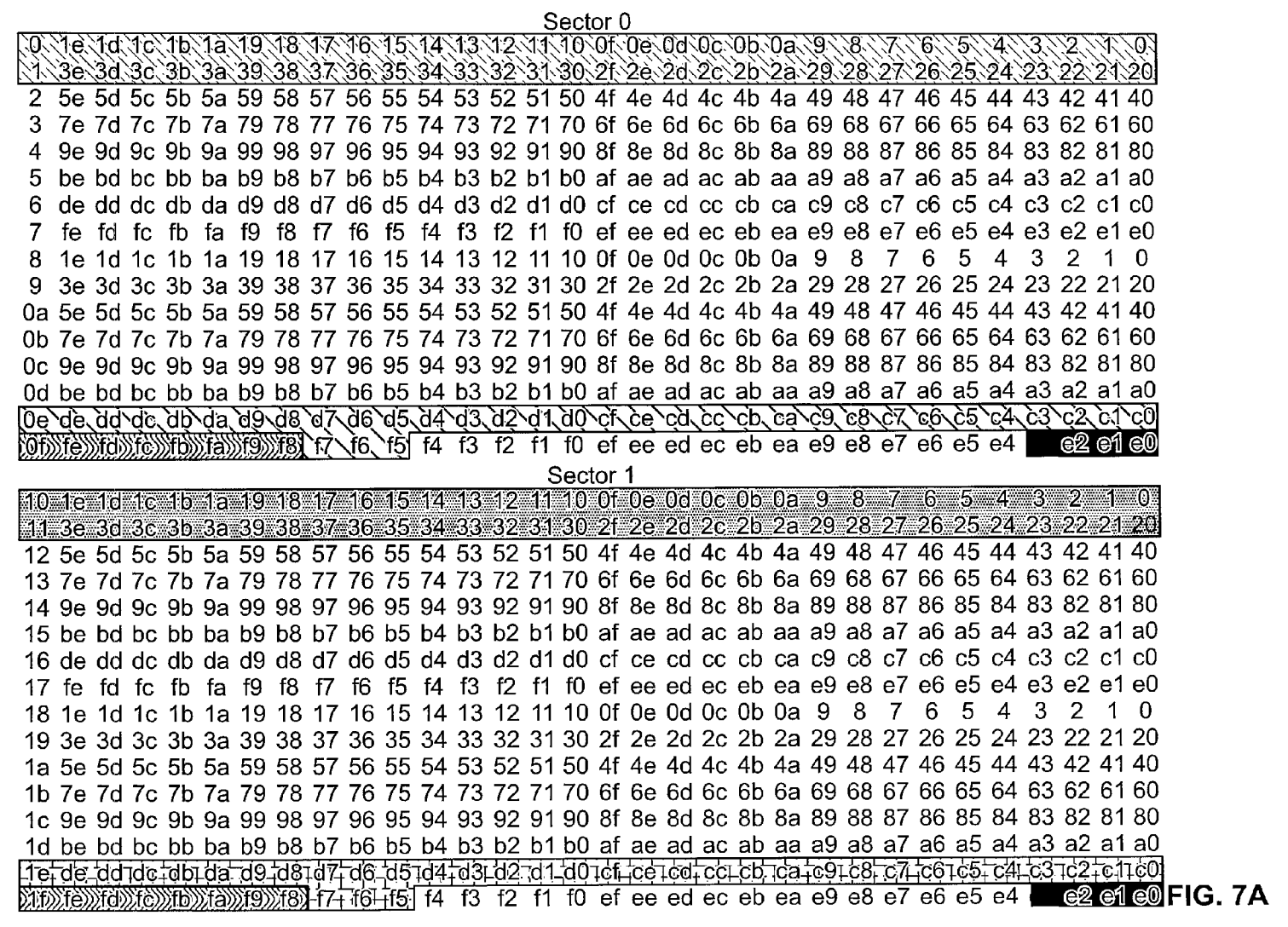
Figure 7B:
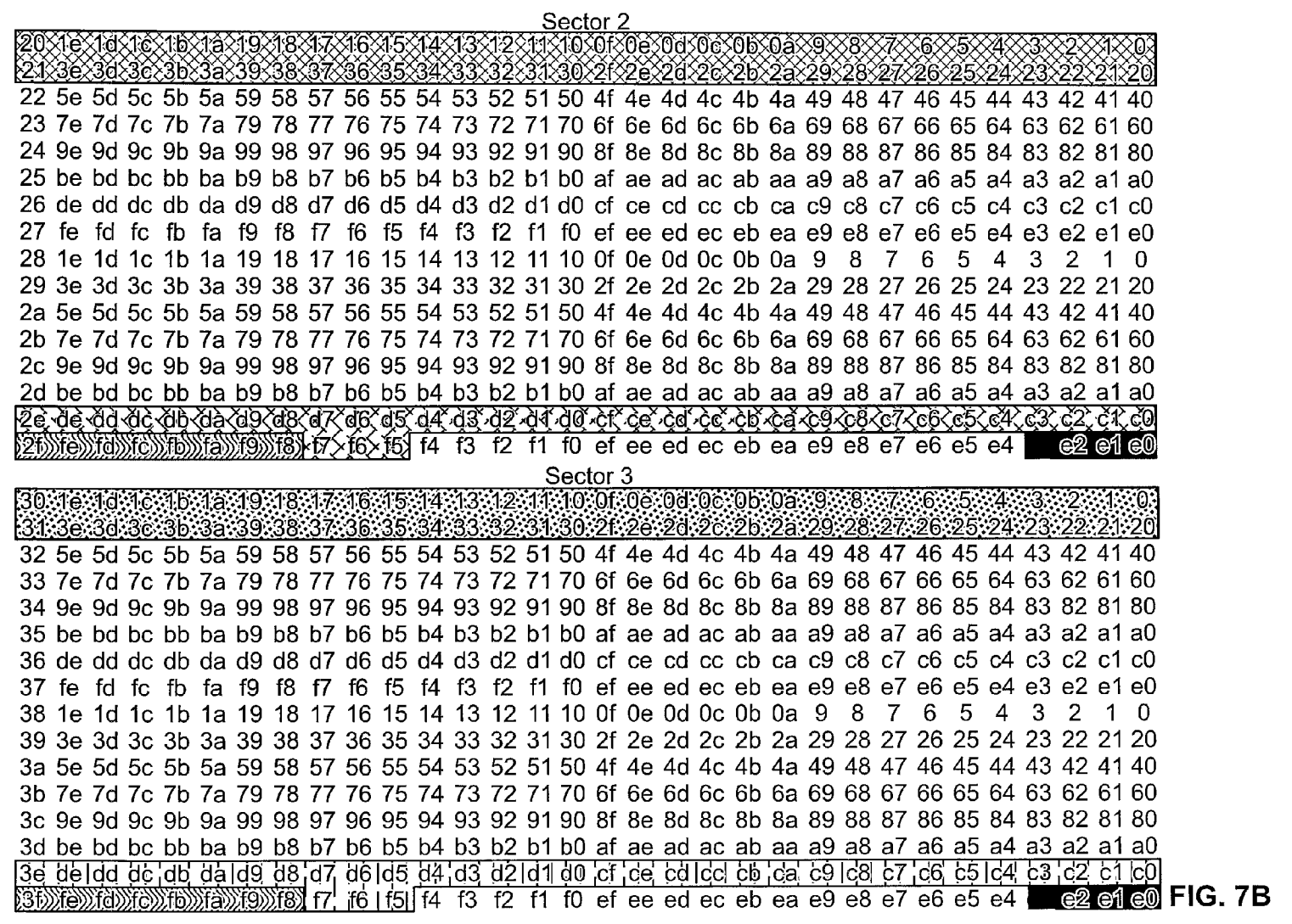
Figure 7C:
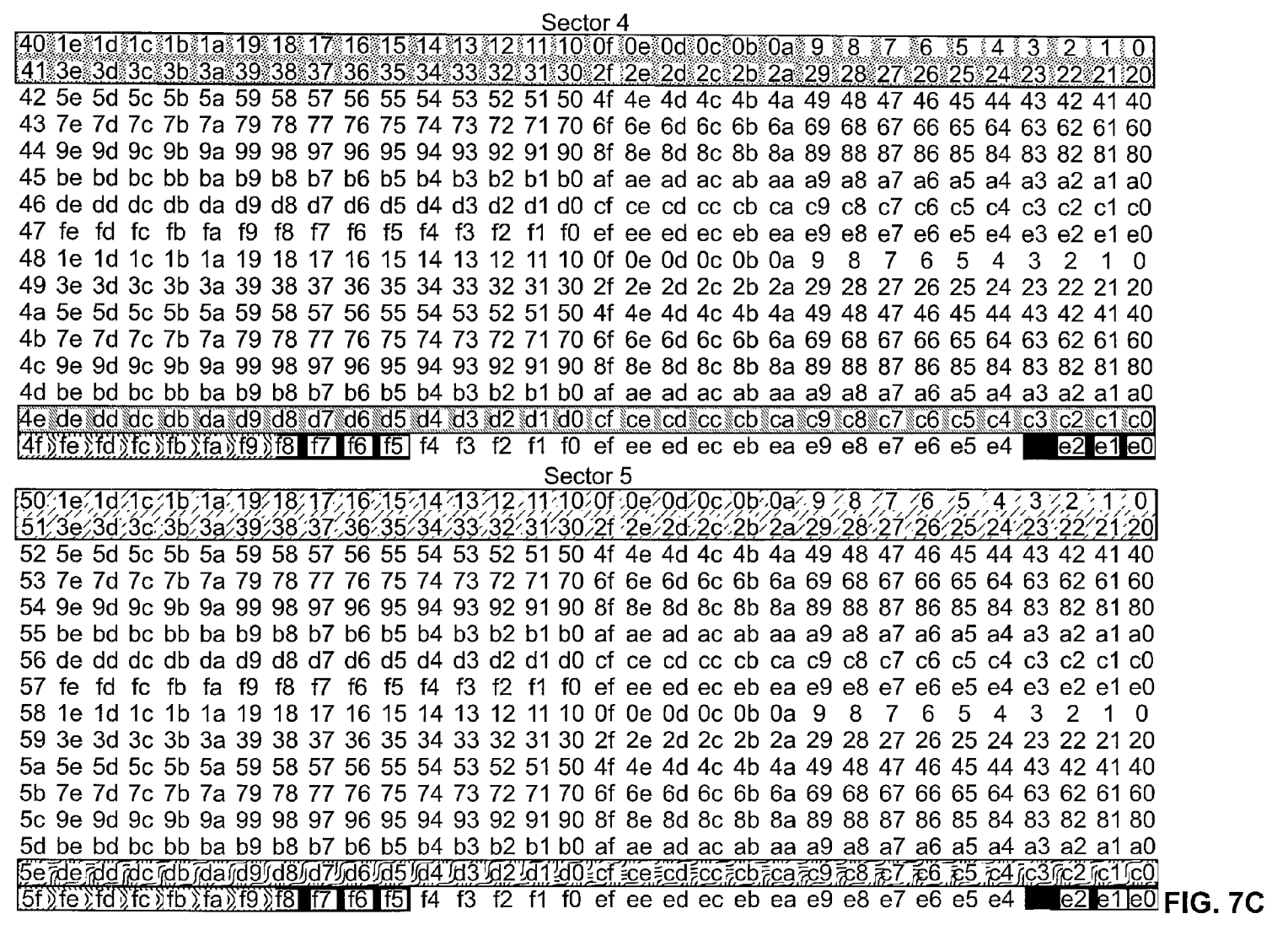
Figure 7D:
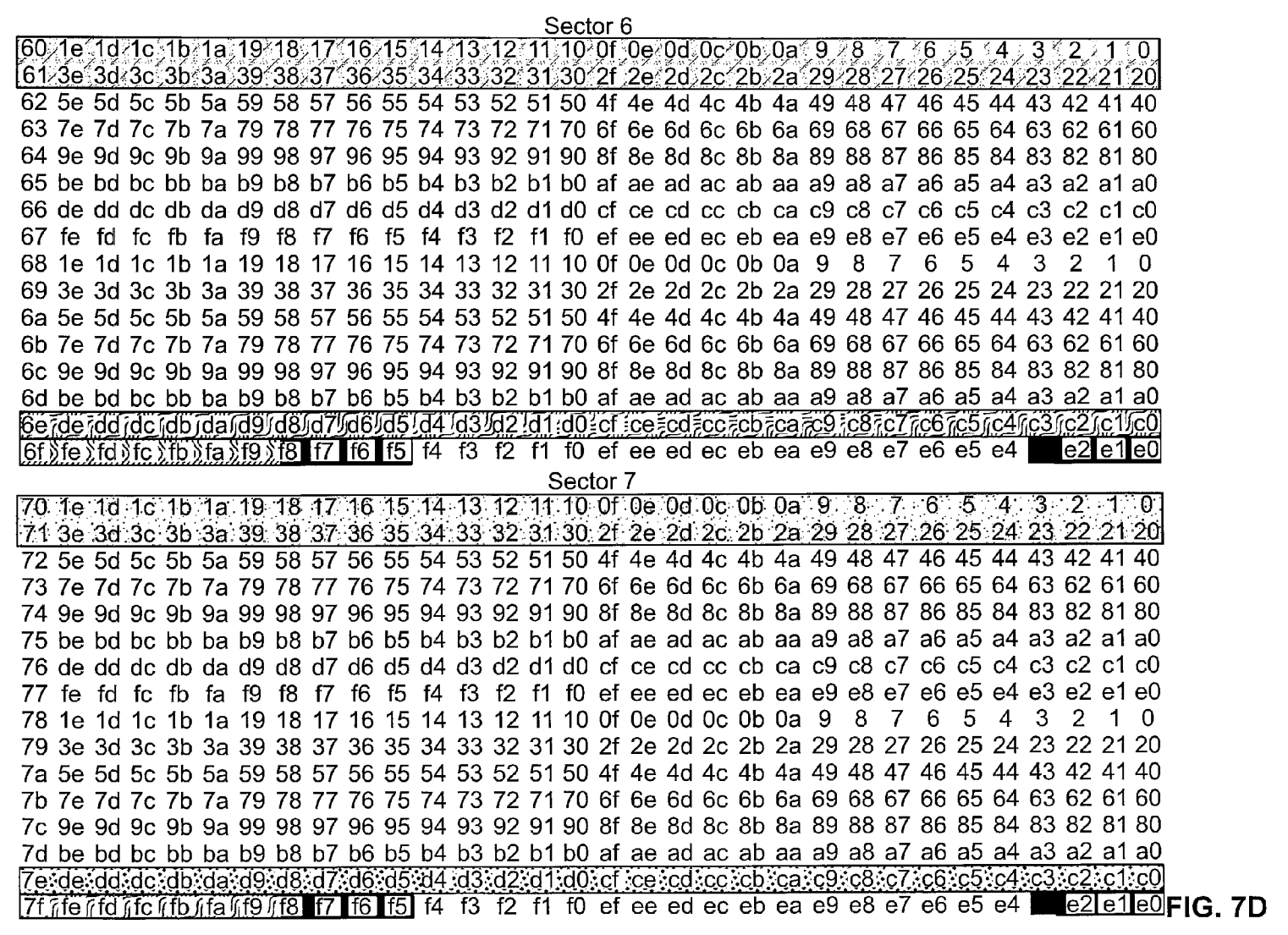
Figure 7E:
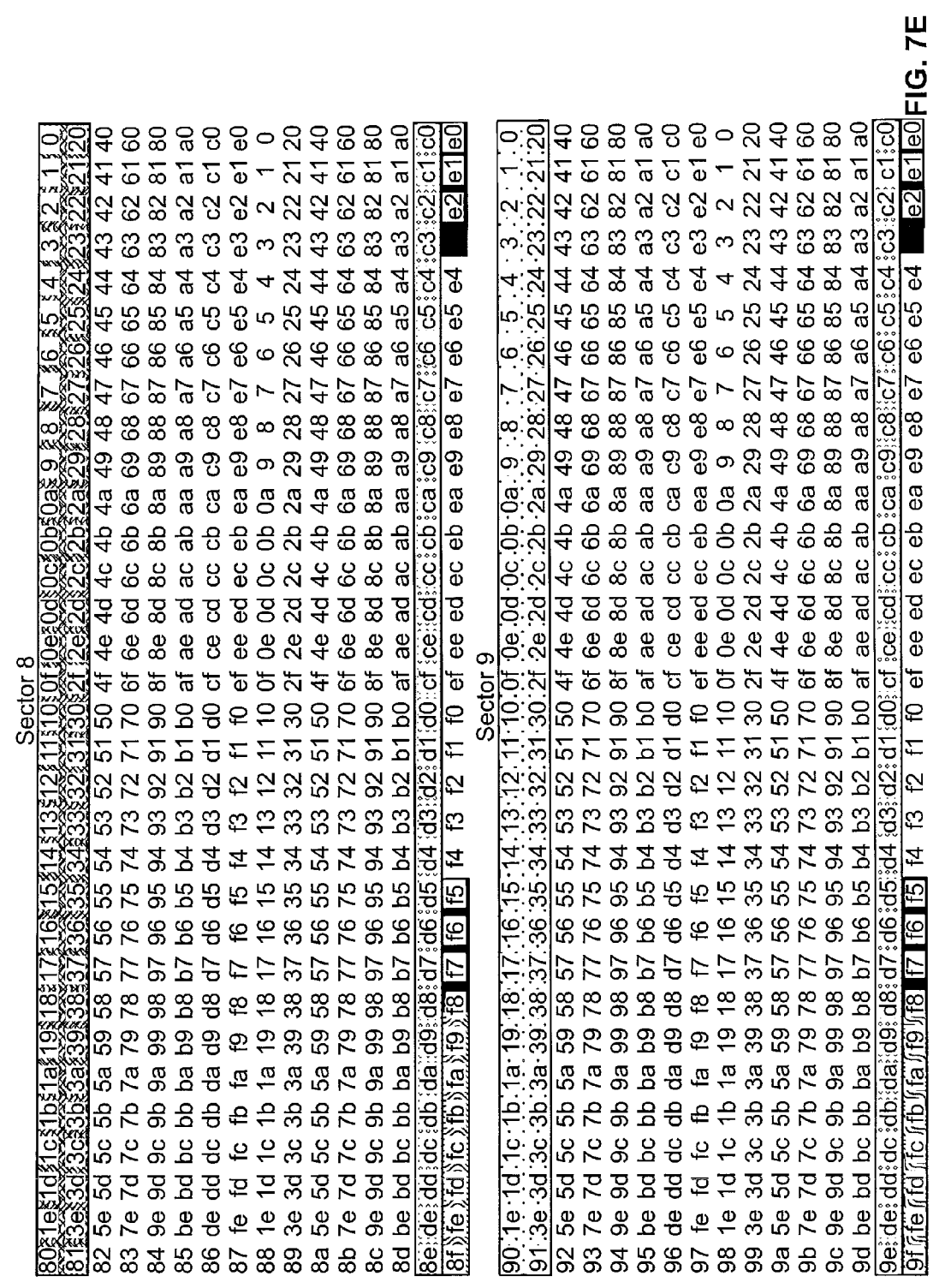
Figure 7F:
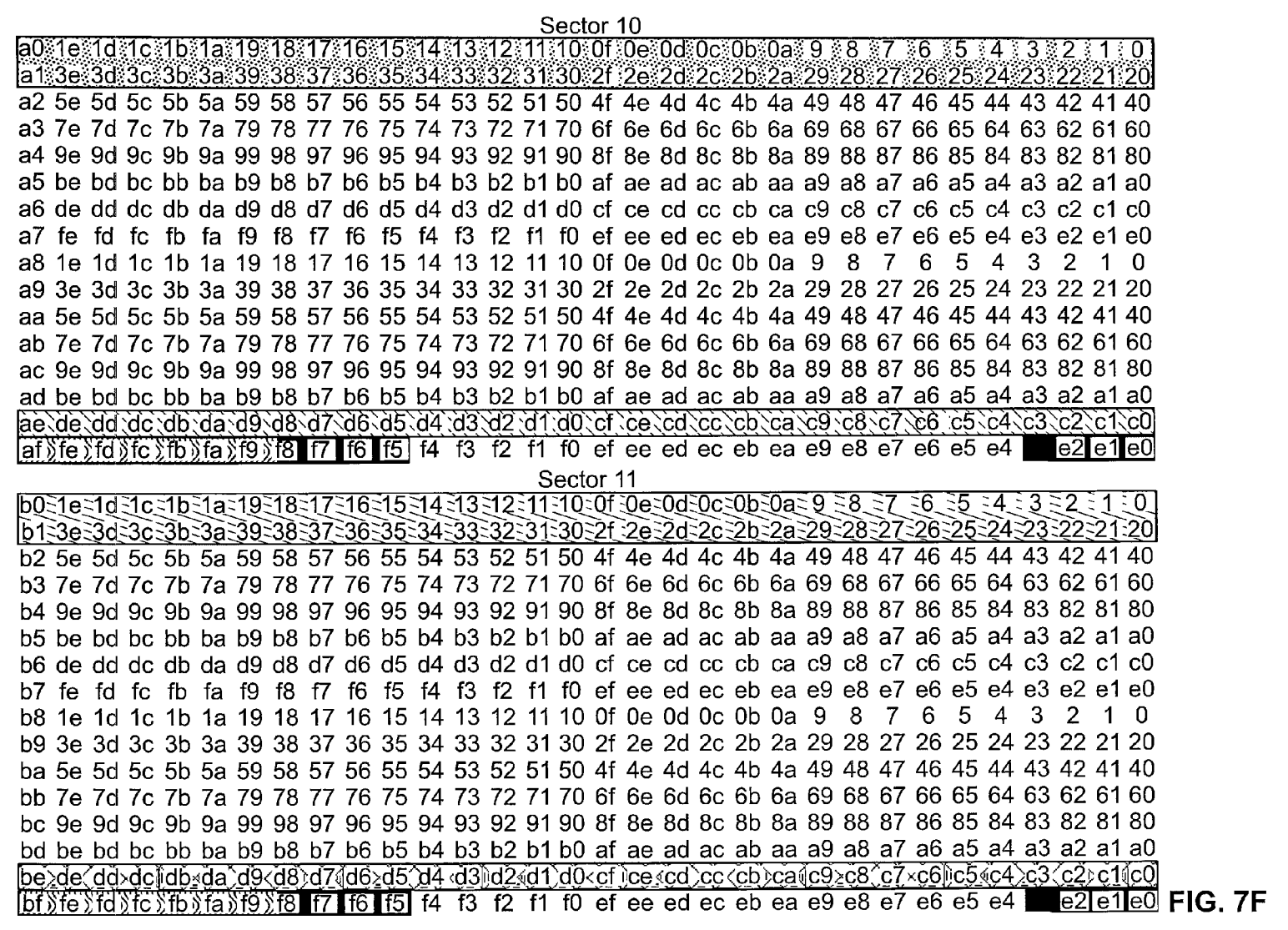
Figure 7G:
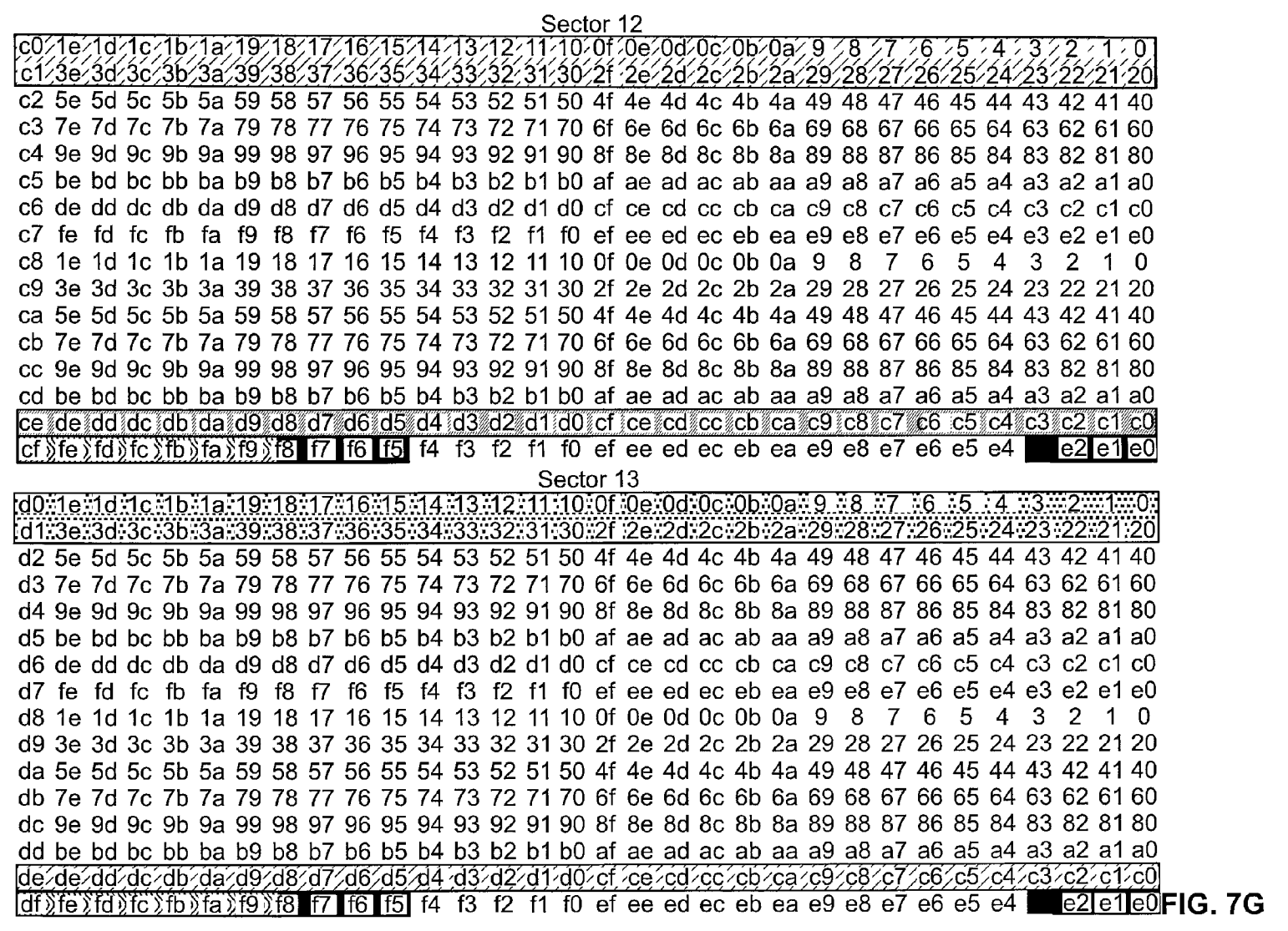
Figure 7H:
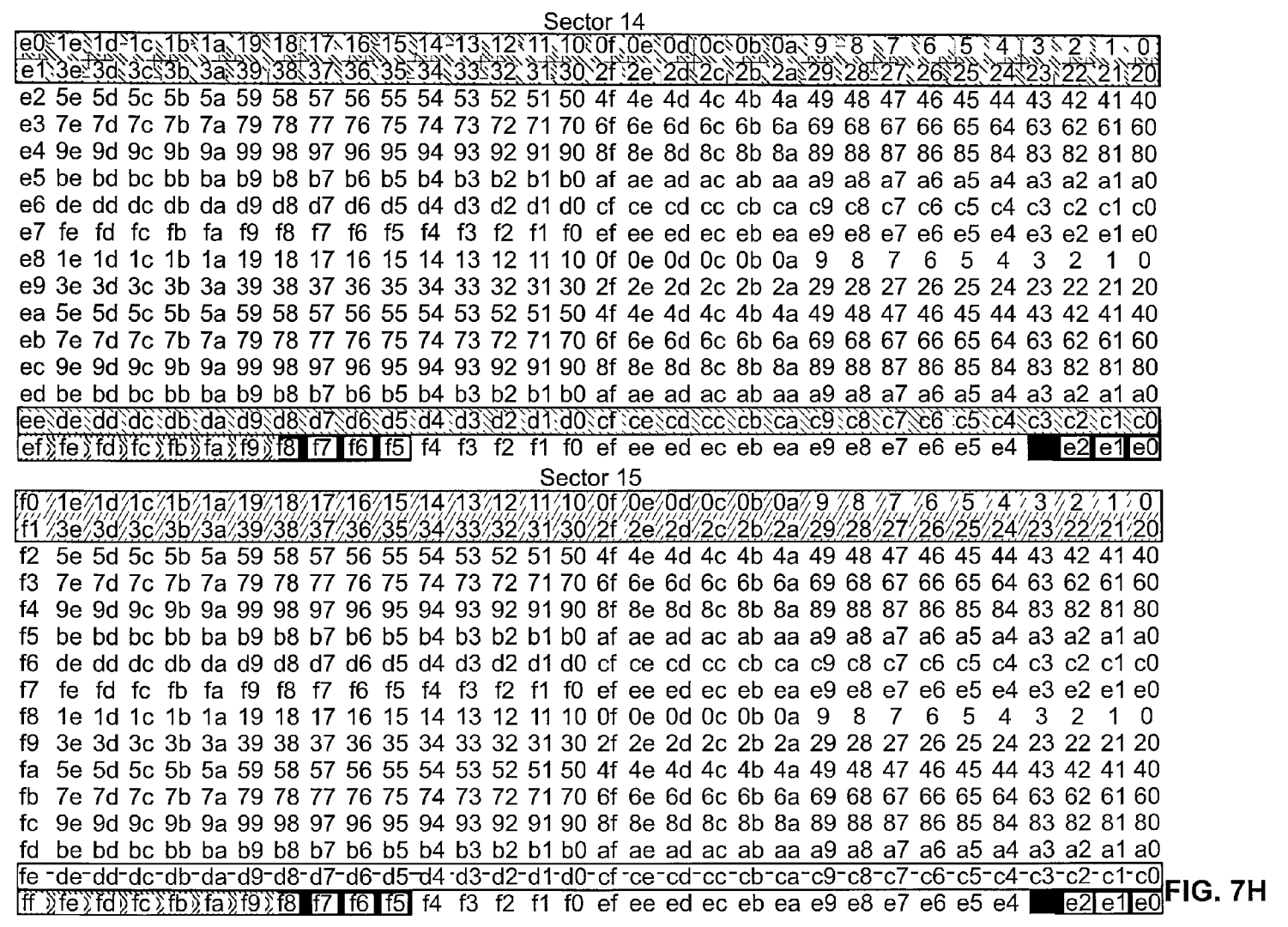
Figure 8A:
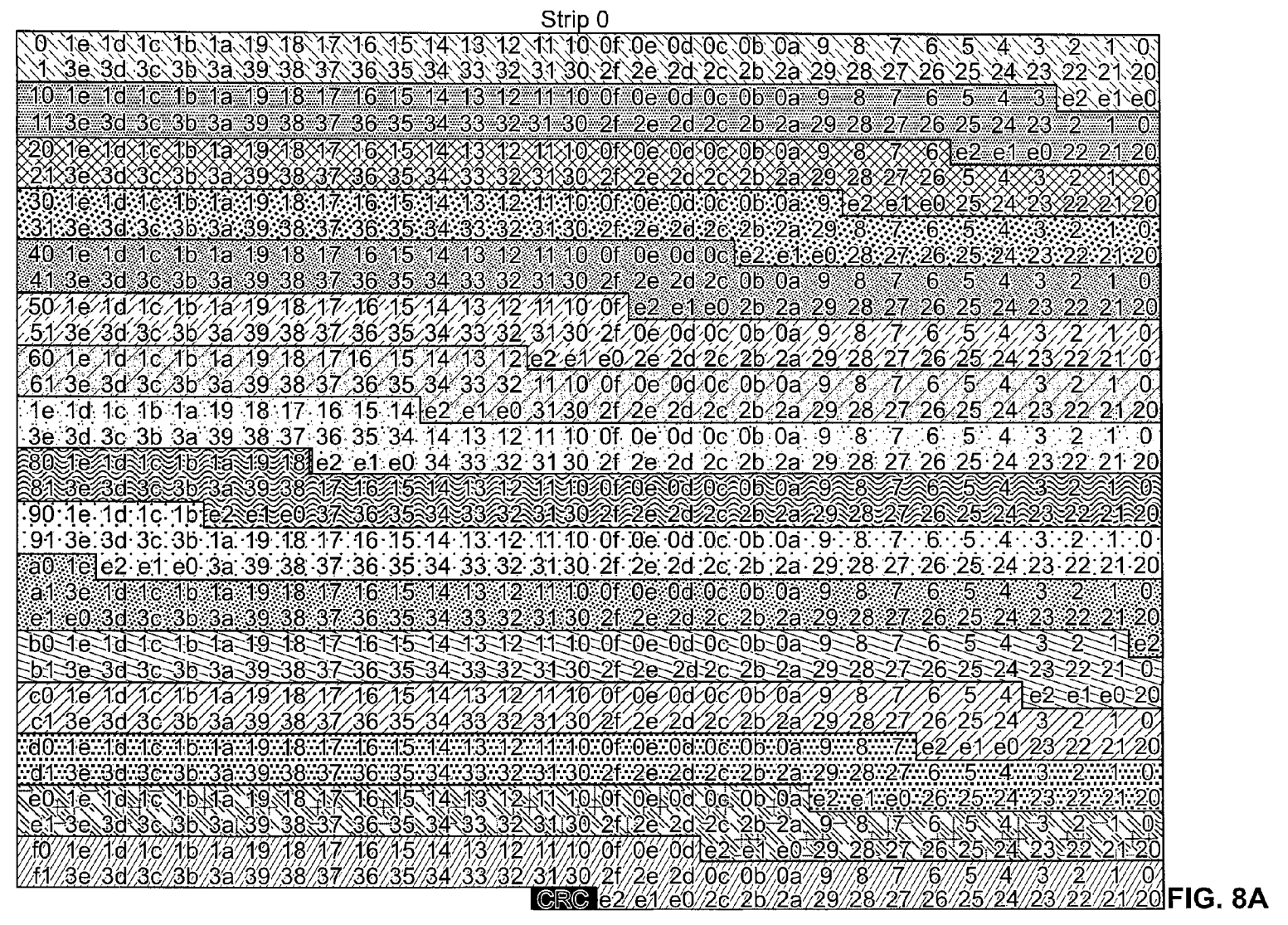
Figure 8B:
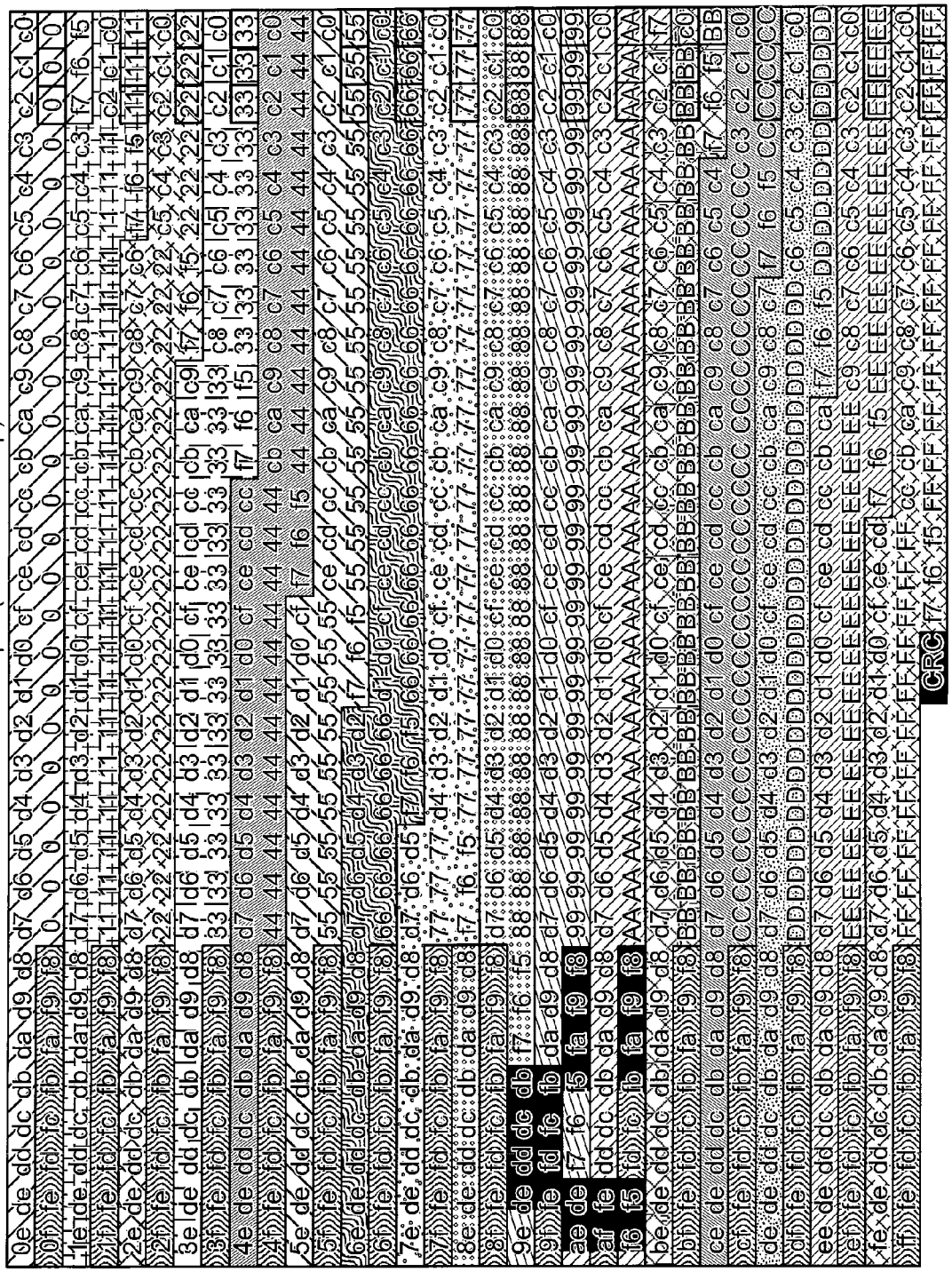
FIG. 8 shows the mapping of the 16 user sectors and associated metadata to a first (A) and last (B) of the 8 user memory circuits (of the RAID stripe is shown in The values of the data shown (in hexadecimal format) correspond to those in FIG. 7A-I.

An example mapping of the 16 user sectors and associated metadata to a first and last of the 8 user memory circuits (that is, not including the parity page) of the RAID stripe is shown in FIG. 8A, B. The values of the data shown (in hexadecimal format) correspond to those in FIG. 7A-I and are meant to assist in understanding the mapping of the data that has been described. That is, they are arbitrary for example purposes, but arranged so as to be ordered and unique to each location in the source page.

The data is seen by the user as 512 bytes, but in this example, the data is striped in increments of 67 bytes rather than 64 bytes, as would be conventional. This results in extended 1 KB user data increments that use the space previously occupied by metadata (both T10 DIF and storage system) in the destination page to store user data, leaving space in MM7 for the metadata and any remaining user data.

That is, the metadata of the 17th sector is stored in the 8th strip along with the fragments of data of each of the user data sectors that have been remapped. A 9th strip is computed as parity. The concept of a 17th block may not be literal, as the data may be mapped using a look-up table or an algorithm so as to avoid data relocation in the input buffer 11. An example of an efficient mapping algorithm is presented in the appendix. Look-up tables and other maps are also possible.

An example of an efficient mapping algorithm is based on a cyclic permutation group algorithm A permutation group is a group G whose elements are permutations of a given set M, and whose group operation is the composition of permutations in G (which are thought of as bijective functions from the set M to itself); the relationship is often written as (G,M).

Let us denote the elements of the group G as $\{g_0, g_1, g_2, \ldots, g_k\}$; and denote the permutation rule by P. Applying the permutation n number of times is denoted by $P^n$, and is interpreted as:

$$P^1=1$$

$$P^2=P \circ P$$

$$P^3 P \circ P \circ P = P \circ P^2$$

$$P^{n+1}=P \circ P^n$$

The transition from one element of the group G to another element is done by applying the permutation rule on the given element.

Starting from $g_0$ we get $g_1$ by applying the permutation rule once on $g_0$. i.e., $g_1=P(g_0)$.

Starting from $g_0$ we get $g_2$ by applying the permutation rule twice on $g_0$. i.e., $g=P \circ P(g)=P^2(g)$ And so, to get $g_n$ from $g_0$, we apply the permutation n times on $g_0$, i.e., $g_n=P(g_0)$ If, after applying the permutation K a finite number of time on $g_0$ we get back $g_0$, then the group is a cyclic permutation group with length of K. The permutations can be represented as: $(1, P, P^2, P^3, \ldots, P^n, \ldots P^K)$ 8 KB Native Block Size Case:

Input: 1. Linear data of length multiples of 64 Bytes (512 bits), between 1 to 16.

2. Offset of starting block (start offset) from the origin of the block, between 0 to 31.

WR Pack Algorithm:

1. Calculate (end offset=offset of last block of 64 Bytes)
2. For (current_offset=start offset to end offset) do:
2.1. Take 64 Bytes of data.
2.2 Take 3 Bytes from last entry of 32 Bytes of data,
2.3 Append the 3 Bytes from 2.2 to the 64 Bytes from 2.1 and create a block of 67 Bytes.
2.4 Apply the permutaion_67 on the 67 Bytes, number of times=current_offset.
2.5 Append the resulted output to the end of data of strip function bit[66:0] do_permutaion_67 (bit[66:0] in_data);
bit[66:0] local_temp_data;
//1st Permutation 0
//[63:61]<-[34:32]
//[34:32]<-[2:0]
local_temp_data=in_data;
for (int n=3; n<64; n++) begin
local_temp_data[n–3]=in_data[n];
local_temp_data[61]=in_data[32];
local_temp_data[62]=in_data[33];
local_temp_data[63]=in_data[34];
local_temp_data[29]=in_data[0];
local_temp_data[30]=in_data[1];
local_temp_data[31]=in_data[2];
end
return local_temp_data;
endfunction:do_permutaion_67

This permutation works as follows: Bytes[34:32] move to location[63:61]. Bytes[2:0] moves to location[34:32]

This permutation has a cycle length of 32. i.e., after 32 permutations we get $$P^{32}=P^0=1$$

READ Algorithm

For the read operation, each time we read a block of 67 Bytes, we need to execute number of permutations to complement them to 32, and we get back the original data. This is because $P^{32}=P^0=1$.

For example, if the 67 Bytes offset was 10, then in the WR operation we did the following permutation $P^{10}$, there for in the read operation we need to execute $P^{20}$ permutations.

4 KB Native Block Size Case

Input: 1. Linear data of length multiples of 64 Bytes (512 bits), between 2 to 32.

2. Offset of starting block (start offset) from the origin of the block, between 0 to 15.

WR Pack Algorithm:

1. Calculate (end offset=offset of last block of 64 Bytes)
2. For (current_offset=start offset to end offset) do:
2.1. Take 128 Bytes of data.
2.2 Take 6 Bytes from last entry of 32 Bytes of data,
2.3 Append the 6 Bytes from 2.2 to the 64 Bytes from 2.1 and create a block of 134 Bytes.
2.4 Apply the permutaion_134 on the 134 Bytes, number of times=current_offset.
2.5 Append the resultant output to the end of data of strip function bit[133:0] do_permutaion_134 (bit[133:0] in_data);
bit [133:0] local_temp_data;
//1st Permutation 0
//[63:61]<-[34:32]
//[34:32]<-[2:0]
//[127:122]<-[69:64
//[69:64]<-[5:0]
local_temp_data=in data;
for (int n=6; n<128; n++) begin
local_temp_data[n–6]=in_data[n];
local_temp_data[58]=in_data[32];
local_temp_data[59]=in_data[33];
local_temp_data[60]=in_data[34];
local_temp_data[61]=in_data[35];
local_temp_data[62]=in_data[36];
local_temp_data[63]=in_data[37];
local_temp_data[26]=in_data[0];
local_temp_data[27]=in_data[1];
local_temp_data[28]=in_data[2];
local_temp_data[29]=in_data[3];
local_temp_data[30]=in_data [4];
local_temp_data[31]=in_data[5];
local_temp_data[90]=in_data[64];
local_temp_data[91]=in_data[65];
local_temp_data[92]=in_data[66];
local_temp_data[93]=in_data[67];
local_temp_data[94]=in_data[68];
local_temp_data[95]=in_data[69];
local_temp_data[122]=in_data[96];

```
local_temp_data[123]=in_data[97];
local_temp_data[124]=in_data[98];
local_temp_data[125]=in_data[99];
local_temp_data[126]=in_data[100];
local_temp_data[127]=in_data[101];
end
return local_temp_data;
endfunction:do_permutaion_134
```

This permutation has a cycle length of 32. i.e. after 32 permutations we get $P^{32}=P^0=1$ Read Algorithm:

For the read operation, each time we read a block of 134 Bytes, we need to execute number of permutations to complement them to 32, and we get back the original data. This is because $P^{32}=P^0=1$.

For example, if the 134 Bytes offset was 10, then in the WR operation we did the following permutation $P^{10}$, there for in the read operation we need to execute $P^{20}$ permutations.

The above algorithm is presented in detail for the benefit of a full understanding of an example of a practical use of the technique described herein. However, a person of skill in the art will appreciate that other algorithms and data structures will also be practical.

In an aspect, pages of user data 300 that are amenable to data compression may be assembled into pages such as shown in FIG. 6, but pages 0-6, having no information, need not actually be stored. The FTL of the MM, for example, may allocate blank pages to fictive physical memory locations so that only the data and metadata that was mapped to MM7 is retained. By using this indirection, the blank (compressed) pages are represented compactly in the system metadata, and the physical memory is not written to or read when this LBA is accessed, except to retrieve data on MM7, and MM8 if parity data is needed. The result is that the bus loading internal to the memory module MM is reduced, and the number of times that each block of physical memory needs to be erased as part of a garbage collection or wear leveling operation is reduced, contributing to increased lifetime of the physical memory. Unlike RAID-5 where the parity is rotated among the columns which in this approach may correspond to memory modules, it may be desirable to rotate, or scramble or otherwise permute the mapping of data as well as the parity to the modules so that the effects of compressing the data are distributed move uniformly over the modules.

The method of permuting the user data block before storage may be selected from a method or specific algorithmic permutation based on address, file, or LUN to which the data belongs, or selected based on configuration settings or hints that may be transmitted with the data by the user. Where the permutation approach is determined by a hint, additional metadata may be stored to indicate how to recover the data. If the number of permutations is limited, recovery of the data may be possible without any additional stored metadata by trying to perform the recovery using some or all of the known permutations and selecting the one which correctly passes various tests of data consistency.

Examples of specialized permutations could involve assigning the first and last few bytes of a block plus the T10 data to a single MM, which in the case of many databases would place all the block signatures in one location and for blocks that were otherwise empty cause all but one of the MMs to receive data which was all 0's and could be eliminated at the MM rather than performing the compression at the MM controller.

Another example of a permutation that would allow specialized data reduction would be to move every Nth (4 byte) word to a single MM which, in the case of blank VMWare data blocks that contain a single pattern with every Nth word having an increasing sequence number, would move all the sequence numbers to a single MM and leave the rest of the data blocks with a simple replaced pattern, avoiding the need to store more than a metadata reference. The MM containing all the sequence numbers and some amount of the replaced pattern could store the first sequence number and its starting byte position and regenerate the rest of the data when servicing a read request.

In the aspect where the MM controller may be performing the packing of the pages for the memory module blocks on the MM then the controller may take the metadata from each user data block and pack the metadata together along with permuting the user data block so that, in the case of the data being compressed or eliminated, many MMs do not have to store more than a metadata note indicating the data for that location is 0 or some other simple pattern.

It will be appreciated that the methods described and the apparatus shown in the figures may be configured or embodied in machine-executable instructions, e.g. software, or in hardware, or in a combination of both. The machine-executable instructions can be used to cause a general-purpose computer, a special-purpose processor, such as a DSP or array processor, or the like, that acts on the instructions to perform functions described herein. Alternatively, the operations might be performed by specific hardware components that may have hardwired logic or firmware instructions for performing the operations described, or by any combination of programmed computer components and custom hardware components, which may include analog circuits.

The methods may be provided, at least in part, as a computer program product that may include a non-volatile machine-readable medium having stored thereon instructions which may be used to program a computer (or other electronic devices) to perform the methods. For the purposes of this specification, the terms "machine-readable medium" shall be taken to include any medium that is capable of storing or encoding a sequence of instructions or data for execution by a computing machine or special-purpose hardware and that may cause the machine or special purpose hardware to perform any one of the methodologies or functions of the present invention. The term "machine-readable medium" shall accordingly be taken include, but not be limited to, solid-state memories, optical and magnetic disks, magnetic memories, and optical memories, as well as any equivalent device that may be developed for such purpose.

For example, but not by way of limitation, a machine readable medium may include read-only memory (ROM); random access memory (RAM) of all types (e.g., S-RAM, D-RAM. P-RAM); programmable read only memory (PROM); electronically alterable read only memory (EPROM); magnetic random access memory; magnetic disk storage media; flash memory, which may be NAND or NOR configured; memory resistors; or electrical, optical, acoustical data storage medium, or the like. A volatile memory device such as DRAM may be used to store the computer program product provided that the volatile memory device is part of a system having a power supply, and the power supply or a battery provides power to the circuit for the time period during which the computer program product is stored on the volatile memory device.

Furthermore, it is common in the art to speak of software, in one form or another (e.g., program, procedure, process, application, module, algorithm or logic), as taking an action or causing a result. Such expressions are merely a convenient way of saying that execution of the instructions of the software by a computer or equivalent device causes the processor of the computer or the equivalent device to perform an action or a produce a result, as is well known by persons skilled in the art.

Although only a few exemplary embodiments of this invention have been described in detail above, those skilled in the art will readily appreciate that many modifications are possible in the exemplary embodiments without materially departing from the novel teachings and advantages of the invention. Accordingly, all such modifications are intended to be included within the scope of this invention.

What is claimed is:

1. A method of operating a memory system having a controller and a memory module, comprising:
   receiving, by the controller, a data structure having a user data block and user metadata for the user data block;
   separating the user data block from the user block metadata, if any;
   storing a plurality of user data blocks without the user block metadata such that the plurality of user data blocks occupy contiguous memory locations of a page of memory;
   storing the plurality of user block metadata such that the plurality of user block metadata occupy contiguous memory locations of the page of memory.

2. The method of claim 1, further comprising:
   reading the page of memory in response to a read command from a user and combining the user data block and the corresponding stored user block metadata to reform the data structure; and
   returning the data structure to the user.

3. The method of claim 1, further comprising:
   processing the plurality of user data blocks forming a page of memory to determine if a repeating data pattern is present;
   determining a type of repeating data pattern and a run length for each repeating data pattern;
   storing the data pattern designation and run length for each repeating data pattern as data metadata;
   deleting the user data corresponding to the repeating data pattern; and
   writing the data metadata to non-volatile memory.

4. The method of claim 3, further comprising:
   reading the data metadata for a page of memory in response to a read command from a user and generating the repeating data pattern of a user data block identified by the data metadata and combining the user data block and the corresponding user block metadata to reform the data structure; and
   returning the data structure to the user.

5. The method of claim 1, further comprising:
   creating a strips of a RAID stripe from a page of user data blocks and the any metadata associated with the page of user data blocks;
   computing an error correcting code over the user data blocks and the metadata;
   storing the strips of data on a plurality of memory modules and the error correcting code on another memory module such that the data and metadata is reconstructable using less that all of the memory modules.

6. The method of claim 5, further comprising:
   processing the plurality of user data blocks forming a page of memory of a memory module to determine if a repeating data pattern is present;
   determining a type of data pattern and a run length for each repeating data pattern;
   storing the data pattern designation and run length for each repeating data as metadata;
   deleting the user data of the user data blocks corresponding to the repeating data pattern; and
   writing the metadata to non-volatile memory.

7. The method of claim 6, further comprising:
   reading the metadata for a RAID stripe in response to a read command from a user and generating the repeating data pattern of a user data block identified by the metadata and combining the user data block and the corresponding user block metadata to reform the data structure; and
   returning the data structure to the user.

8. The method of claim 7, wherein the value of user block metadata used to reform the data structure has the same the same value as originally received from the user.

9. The method of claim 7, wherein the user block metadata received from the user conforms to the T10-DIF standard.

10. A method of operating a memory system having a controller and a memory module, comprising:
    receiving, by the controller, a data structure having a user data block and user block metadata for the user data block;
    processing a user data block to determine if a repeating data pattern is present;
    determining a type of repeating data pattern and a run length for each repeating data pattern;
    forming data metadata representing the data pattern designation and data metadata for the repeating data pattern;
    deleting the data corresponding to the repeating data pattern;
    forming a block of data from the user block metadata and the data metadata; and
    writing the user data block and data metadata, if any, to a non-volatile memory module.

11. The method of claim 10, further comprising:
    computing an error correcting code for the data stored to non-volatile memory; and
    writing the error correcting code to a memory module not containing the user block data, data metadata, or user block data.

12. The method of claim 11, further comprising:
    reading one of the user block metadata and data metadata or the error correcting code in response to a read command from a user and identifying the data metadata corresponding to the data structure of the read command;
    reconstructing the repeating data pattern using the data metadata to form the user data block;
    combining the user data block and the corresponding user block metadata to reform the data structure;
    returning the data structure to the user.

13. The method of claim 10, wherein the user block metadata and the data metadata are stored in a first portion of a logical page and the user block data, if any, is stored in a second portion of the logical page.

14. The method of claim 10, wherein a page of logical data is written to a plurality of memory modules in a RAID stripe.

* * * * *